(12) United States Patent
Sugawara

(10) Patent No.: US 8,723,336 B2
(45) Date of Patent: May 13, 2014

(54) SEMICONDUCTOR LIGHT EMITTING DEVICE AND METHOD FOR MANUFACTURING SAME

(75) Inventor: Yasuharu Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 13/472,310

(22) Filed: May 15, 2012

(65) Prior Publication Data

US 2013/0153920 A1     Jun. 20, 2013

(30) Foreign Application Priority Data

Dec. 16, 2011   (JP) .................................. 2011-276137

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01L 29/267* | (2006.01) |
| *H01L 29/16* | (2006.01) |
| *H01L 29/161* | (2006.01) |
| *H01L 29/167* | (2006.01) |
| *H01L 29/18* | (2006.01) |
| *H01L 29/201* | (2006.01) |
| *H01L 29/205* | (2006.01) |
| *H01L 29/207* | (2006.01) |
| *H01L 21/00* | (2006.01) |

(52) U.S. Cl.
USPC ............... 257/783; 257/782; 257/79; 257/80; 257/81; 257/82; 257/83; 257/84; 257/85; 257/86; 257/87; 257/88; 257/89; 257/90; 257/91; 257/92; 257/93; 257/94; 257/95; 257/96; 257/97; 257/98; 257/99; 257/100; 257/101; 257/102; 257/103; 438/118; 438/119

(58) Field of Classification Search
None
See application file for complete search history.

(56) References Cited

U.S. PATENT DOCUMENTS

| | | | |
|---|---|---|---|
| 7,105,857 B2* | 9/2006 | Nagahama et al. | ............. 257/86 |
| 2006/0006398 A1* | 1/2006 | Hata | ............................... 257/94 |
| 2008/0035949 A1* | 2/2008 | Fudeta et al. | ..................... 257/99 |
| 2011/0042708 A1* | 2/2011 | Nihei et al. | ...................... 257/99 |
| 2011/0215364 A1 | 9/2011 | Sugawara et al. | |
| 2012/0070958 A1* | 3/2012 | Furukawa et al. | ............. 438/455 |

FOREIGN PATENT DOCUMENTS

JP         2011-138839         7/2011

* cited by examiner

*Primary Examiner* — Steven Loke
*Assistant Examiner* — Juanita B Rhodes
(74) *Attorney, Agent, or Firm* — Patterson & Sheridan, LLP

(57) ABSTRACT

According to an embodiment, a semiconductor light emitting device includes a light emitting body including a semiconductor light emitting layer, a support substrate supporting the light emitting body, and a bonding layer provided between the light emitting body and the support substrate, the bonding layer bonding the light emitting body and the support substrate together. The device also includes a first barrier metal layer provided between the light emitting body and the bonding layer, and an electrode provided between the light emitting body and the first barrier metal layer. The first barrier layer includes a first layer made of nickel and a second layer made of a metal having a smaller linear expansion coefficient than nickel, and the first layer and the second layer are alternately disposed in a multiple-layer structure. The electrode is electrically connected to the light emitting body.

20 Claims, 6 Drawing Sheets

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from Japanese Patent Application No. 2011-276137, filed on Dec. 16, 2011; the entire contents of which are incorporated herein by reference.

FIELD

Embodiments are related generally to a semiconductor light emitting device and a method for manufacturing the same.

BACKGROUND

A semiconductor light emitting device having a thin-film structure is provided through the manufacturing processes, where a light emitting body including a semiconductor light emitting layer is bonded to a support substrate via a bonding metal. In the bonding process, metal atoms contained in the bonding metal sometimes penetrate into the interface between an electrode connected to the light emitting body and the light emitting body, causing degradation in contact resistance etc. To prevent this, a barrier metal is interposed between the electrode and the bonding metal to suppress movement of metal atoms. However, it is not sufficient to suppress the penetration of the metal atoms.

DETAILED DESCRIPTION

Figure 1:
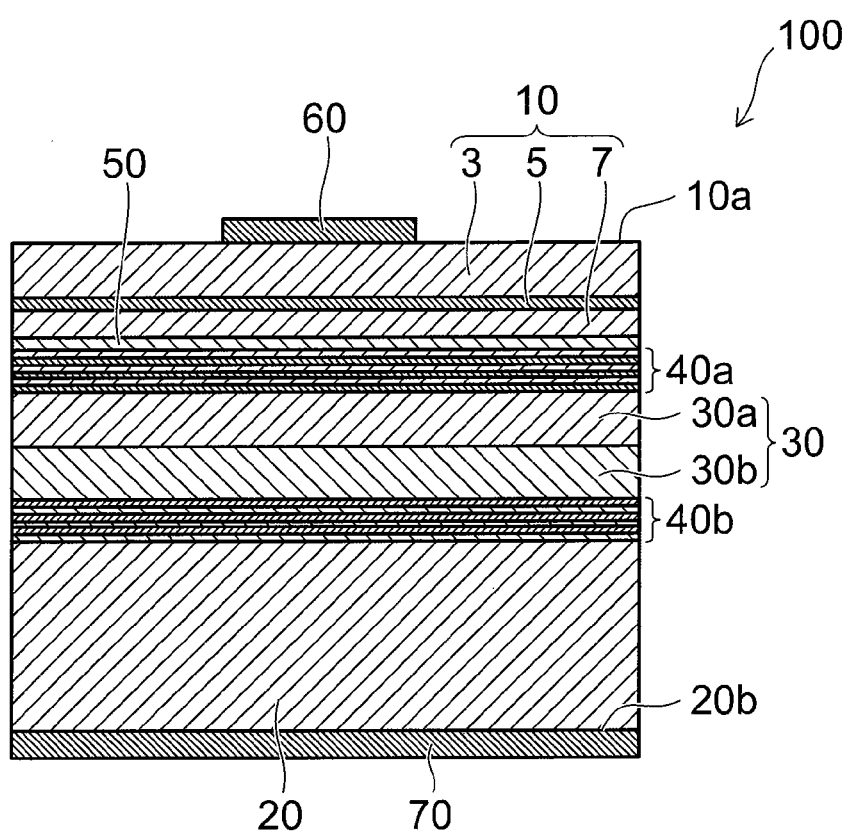
FIG. 1 is a schematic cross-sectional view illustrating a semiconductor light emitting device according to a first embodiment.

According to one embodiment, a semiconductor light emitting device includes a light emitting body including a semiconductor light emitting layer, a support substrate supporting the light emitting body, and a bonding layer provided between the light emitting body and the support substrate, the bonding layer bonding the light emitting body and the support substrate together. The device also includes a first barrier metal layer provided between the light emitting body and the bonding layer, and an electrode provided between the light emitting body and the first barrier metal layer. The first barrier layer includes a first layer made of nickel and a second layer made of a metal having a smaller linear expansion coefficient than nickel, and the first layer and the second layer are alternately disposed in a multiple-layer structure. The electrode is electrically connected to the light emitting body.

Hereinbelow, embodiments of the invention are described with reference to the drawings. Identical components in the drawings are marked with the same reference numerals, and a detailed description thereof is omitted as appropriate and different components are described.

First Embodiment

FIG. 1 is a schematic cross-sectional view showing a semiconductor light emitting device 100 according to a first embodiment. The semiconductor light emitting device 100 is, for example, a light emitting diode (LED) made of a GaN-based nitride semiconductor. The semiconductor light emitting device 100 is an LED having so called a thin-film structure, and includes a light emitting body 10 including a semiconductor light emitting layer and a support substrate 20 supporting the light emitting body 10.

As shown in FIG. 1, a bonding layer 30 is provided between the light emitting body 10 and the support substrate 20, in order to make the bond therebetween. Furthermore, a first barrier metal layer 40a is provided between the light emitting body 10 and the bonding layer 30. The first barrier metal layer 40a includes a multiple-layer structure in which a first layer made of nickel (Ni) and a second layer made of a metal having a smaller linear expansion coefficient than nickel are alternately disposed.

An electrode 50 electrically connected to the light emitting body 10 is provided between the light emitting body 10 and the first barrier metal layer 40a.

The configuration of the semiconductor light emitting device 100 will now be specifically described below.

The light emitting body 10 includes, for example, an n-type GaN layer 3, a light emitting layer 5, and a p-type GaN layer. The light emitting layer 5 has a multi-quantum well (MQW) structure composed of an InGaN well layer and a GaN barrier layer, and emits blue light, for example.

The electrode 50 contains, for example, silver (Ag), and reflects the light emitted from the light emitting layer 5 toward a light emitting surface 10a. In the following, the electrode 50 is referred to as a reflection electrode 50.

The bonding layer 30 includes a first bonding metal layer 30a and a second bonding metal layer 30b. The first bonding metal layer 30a is provided on the reflection electrode 50 via the first barrier metal layer 40a. The second bonding metal layer 30b is provided on the support substrate 20 via a second barrier metal layer 40b. As described later, the light emitting body 10 and the support substrate 20 are bonded together by bonding the first bonding metal layer 30a and the second bonding metal layer 30b together using a thermocompression method.

The second barrier metal layer 40b includes multiple-layer structure in which a Ni layer 41 and, for example, a titanium (Ti) layer 43 having a smaller linear expansion coefficient than Ni are alternately disposed.

An n electrode 60 is selectively provided on the light emitting surface 10a of the light emitting body 10. The n electrode 60 is in ohmically contact with the n-type GaN layer 3. A back surface electrode 70 is provided on the back surface 20b of the support substrate 20.

Next, a method for manufacturing the semiconductor light emitting device 100 according to the first embodiment is described with reference to FIG. 2A to FIG. 4B. FIG. 2A to FIG. 4B are schematic cross-sectional views showing the manufacturing processes.

Figure 2A:
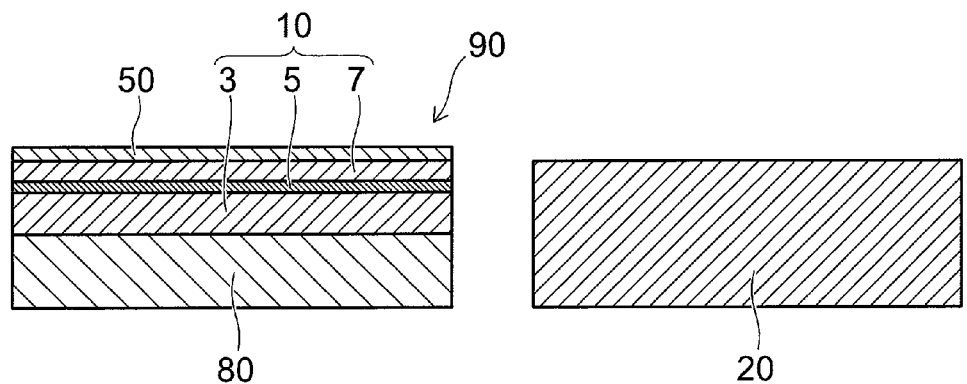
FIG. 2A to FIG. 4B are schematic cross-sectional views illustrating manufacturing processes of the semiconductor light emitting device according to the first embodiment.
Figure 2B:
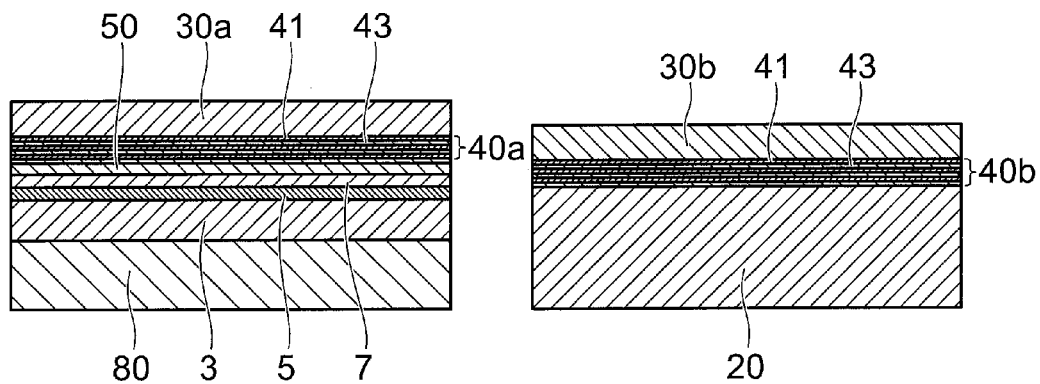

A wafer 90 including the light emitting body 10 and the support substrate 20 are prepared as shown in FIG. 2A. The wafer 90 includes a growth substrate 80, the n-type GaN layer 3 epitaxially grown thereon, the light emitting layer 5, and the p-type GaN layer 7. The reflection electrode 50 is provided on the p-type GaN layer 7.

A sapphire substrate, for example, is used as the growth substrate 80. The n-type GaN layer 3, the light emitting layer 5, and the p-type GaN layer 7 can be formed using the MOCVD (metal organic chemical vapor deposition) method, the MBE (molecular beam epitaxy) method, etc. The reflection electrode 50 is, for example, an Ag layer, and is formed using the vacuum deposition method. The support substrate 20 is, for example, a p-type silicon wafer.

Next, the first barrier metal layer 40a and the first bonding metal layer 30a are sequentially formed on the wafer 90. The second barrier metal layer 40b and the second bonding metal layer 30b are sequentially formed on the support substrate 20.

The first and second barrier metal layers can be formed using, for example, the sputtering method. It is also possible to set the wafer 90 and the support substrate 20 in the same apparatus, and form the first barrier metal layer 40a and the second barrier metal layer 40b simultaneously. That is, the first barrier metal layer 40a may have the same configuration as the second barrier metal layer 40b.

The first barrier metal layer 40a has a multiple-layer structure in which, for example, the Ti layer 43 that is the second layer and the Ni layer 41 that is the first layer are alternately stacked in this order from the reflection electrode 50 side. The linear expansion coefficient of Ti is $8.4 \times 10^{-6}/°$ C., which is smaller than the linear expansion coefficient of Ni, $1.33 \times 10^{-5}/°$ C.

For example, a Ti layer 43 with a thickness of 50 to 500 nanometers (nm) and a Ni layer 41 with a thickness of 50 to 500 nm are alternately stacked. Preferably a Ti layer 43 of 50 to 200 nm and a Ni layer 41 of 50 to 200 nm are alternately stacked. Also the second barrier metal layer 40b is similarly formed on the support substrate 20. The second barrier metal layer 40b may includes the Ni layer 41 as a third layer and the Ti layer 43 as a fourth layer.

The first bonding metal layer 30a and the second bonding metal layer 30b are formed using, for example, the vacuum deposition method or the sputtering method. It is also possible to form the first bonding metal layer 30a and the second bonding metal layer 30b simultaneously into the same configuration. The first bonding metal layer 30a has, for example, a structure in which gold (Au) and gold tin (AuSn) are stacked in this order from the first barrier metal layer 40a side. The thickness of the Au is, for example, 10 to 400 nm, and the thickness of the AuSn is 100 to 5000 nm. Also the second bonding metal layer 30b is similarly formed on the second barrier metal layer 40b.

As a modification example of the embodiment, the second barrier metal layer 40b may have a different configuration from the first barrier metal layer 40a. Furthermore, also a configuration is possible in which one of the first bonding metal layer 30a and the second bonding metal layer 30b has a stacked structure of Au/AuSn and the other is a single layer of Au.

Figure 3A:
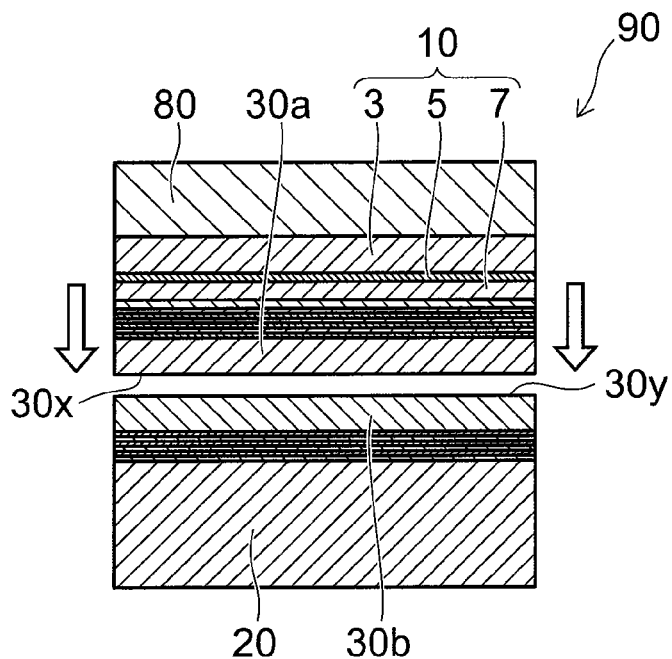

Next, as shown in FIG. 3A, the wafer 90 is stacked on the support substrate 20, and the bonding surface 30x of the first bonding metal layer 30a and the bonding surface 30y of the second bonding metal layer 30b are brought into contact with each other. Furthermore, in a state where pressure is applied from the back surface side of the growth substrate 80 and the back surface side of the support substrate 20, the temperature is increased to bond the first bonding metal layer 30a and the second bonding metal layer 30b together by thermocompression.

Figure 3B:
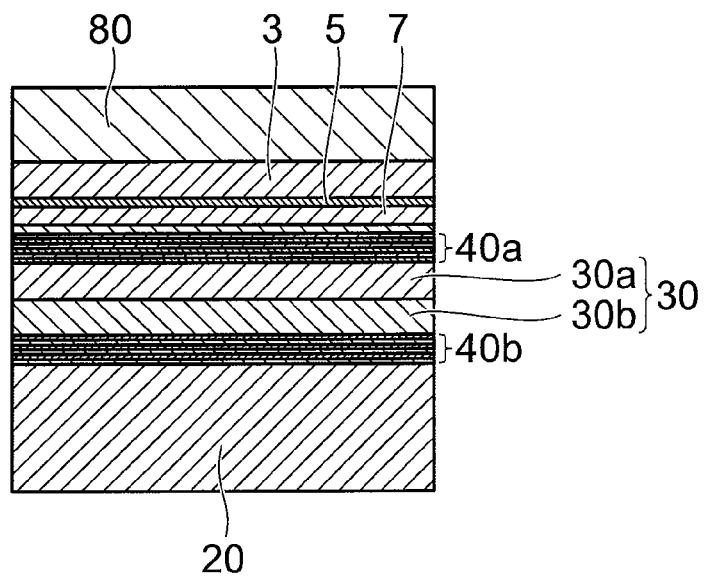

For example, the temperature of the support substrate 20 and the wafer 90 is set not less than 220° C. and not more than 350° C., and they are kept under pressure for not less than 1 minute and not more than 20 minutes. Thereby, as shown in FIG. 3B, the wafer 90 and the support substrate 20 can be bonded together via the bonding layer 30.

Figure 4A:
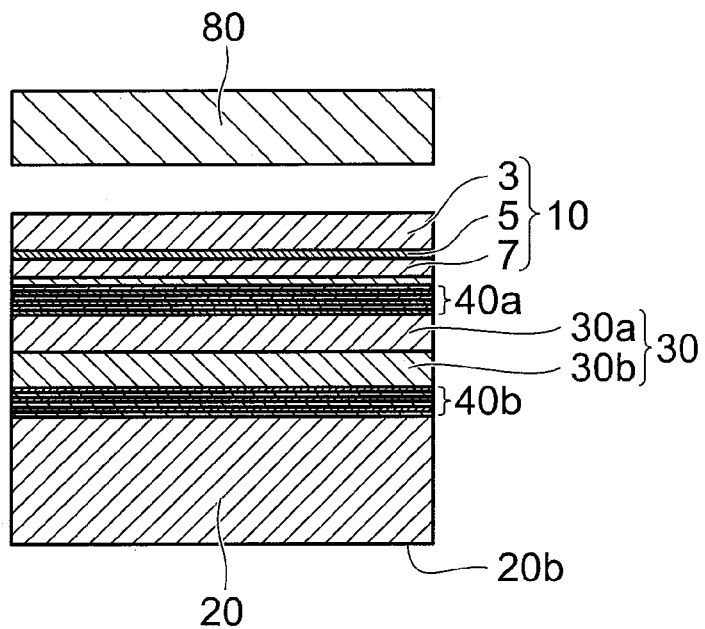

Next, as shown in FIG. 4A, the growth substrate 80 is separated from the light emitting body 10. For example, laser light is applied from the back surface side of the growth substrate 80 to dissociate GaN near the interface between the growth substrate 80 and the n-type GaN layer 3. Thereby, the growth substrate 80 can be removed, leaving the light emitting body 10 on the support substrate 20. The light emitting body 10 is bonded to the support substrate 20 via the bonding layer 30 placed between the first barrier metal layer 40a and the second barrier metal layer 40b.

Figure 4B:
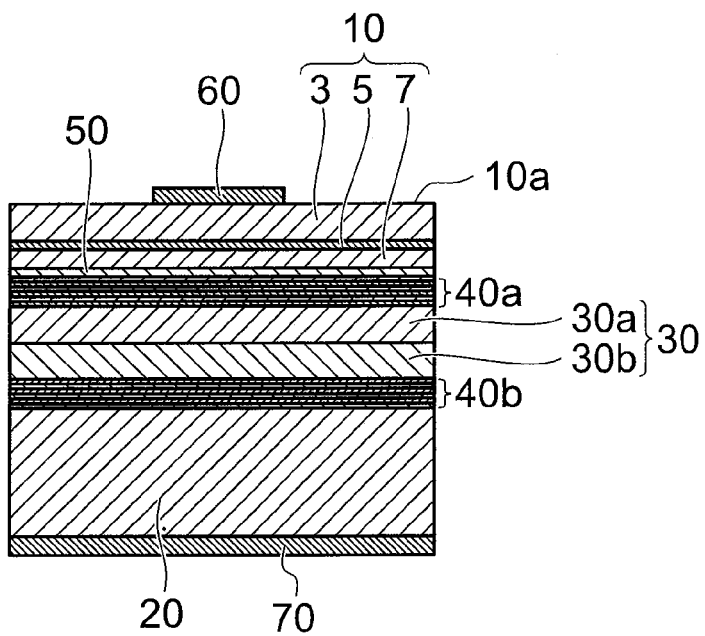

Next, as shown in FIG. 4B, the n electrode 60 is selectively formed on the light emitting surface 10a of the light emitting body 10 from which the growth substrate 80 has been removed. The n electrode 60 is formed using, for example, the vacuum deposition method, and has a stacked structure of Al/Ti/Au. The back surface electrode 70 is formed on the back surface 20b of the support substrate 20, and the semiconductor light emitting device 100 is thus completed.

Figures 5A, 5B:
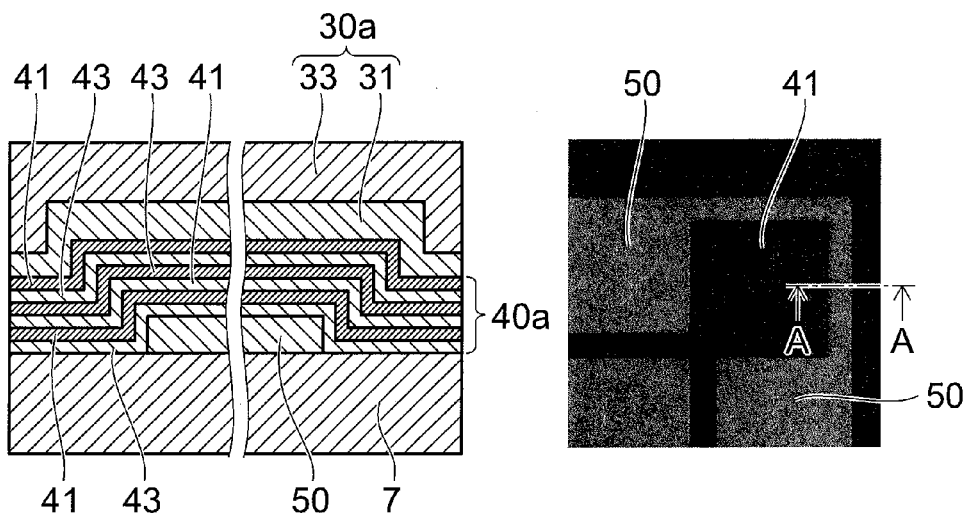
FIGS. 5A to 5D are partial cross-sectional views schematically illustrating bonding structures of the semiconductor light emitting devices and plan photographs of the bonding structures.
Figures 5C, 5D:
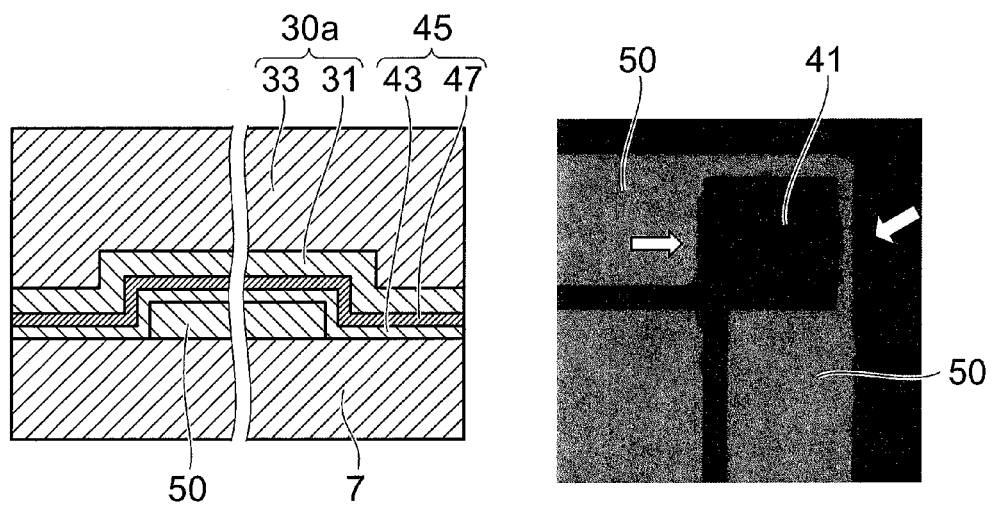

FIGS. 5A to 5D are schematic cross-sectional views showing parts of the bonding structures of semiconductor light emitting devices and plan photographs thereof. FIG. 5A and FIG. 5B show a bonding structure according to the embodiment, and FIG. 5C and FIG. 5D show a bonding structure according to a comparative example.

FIG. 5A is a cross-sectional structure taken along line A-A shown in FIG. 5B. In the embodiment, the first barrier metal layer 40a is provided so as to cover the reflection electrode 50. The first barrier metal layer 40a has a configuration in which the Ti layer 43 that is the second layer and the Ni layer 41 that is the first layer are alternately stacked in this order from the reflection electrode 50 side. Three Ti layers 43 and three Ni layers 41 are stacked. In addition, an Au layer 31 and an AuSn layer 33 are stacked in this order on the first barrier metal layer 40a.

FIG. 5B is a photograph showing the reflection surface of the reflection electrode 50 as viewed from the back surface side of the growth substrate 80 after the wafer 90 and the support substrate 20 are bonded together. Since the sapphire substrate and the GaN-based nitride semiconductor are transparent to visible light, the reflection surface can be directly observed as shown in FIG. 5B.

FIG. 5C shows a cross section of the bonding structure according to the comparative example. A barrier metal layer 45 covering the reflection electrode 50 includes the Ti layer 43 and a platinum (Pt) layer 47 in the comparative example. The Ti layer 43 and the Pt layer 47 are stacked in this order from the reflection electrode 50 side. The Au layer 31 and the AuSn layer 33 are stacked in this order on the barrier metal layer 45.

FIG. 5D is a photograph showing the reflection surface after the wafer 90 and the support substrate 20 are bonded together. In the example, migration of tin (Sn) contained in the first bonding metal layer 30a is seen along the outer periphery and inner periphery of the pattern of the reflection electrode 50. That is, Sn has penetrated into the interface between the reflection electrode 50 and the p-type GaN layer 7. Consequently, the reflectance is reduced at the reflection surface of the reflection electrode 50, and further the ohmic contact is also degraded between the p-type GaN layer 7 and the reflection electrode 50. Thus, the light emitting efficiency is reduced in the semiconductor light emitting device.

In contrast, as shown in FIG. 5B, in the embodiment, migration of Sn is not seen, exhibiting the higher blocking performance of the first barrier metal layer 40a. That is, the penetration of Sn can be prevented by alternately stacking the Ti layer 43 and the Ni layer 41 to form a multiple-layer structure. Thereby, degradation in the reflectance and the ohmic contact of the reflection electrode 50 can be suppressed.

It may be presumed that, for example, also in the barrier metal layer 45 in the comparative example, the barrier properties to Sn can be improved by thickening the Ti layer 43 and the Pt layer 47 or employing a multiple-layer structure. However, both Ti and Pt have a smaller linear expansion coefficient than Ag contained in the reflection electrode 50. Therefore, when the Ti layer 43 and the Pt layer 47 are formed to be thicker, the thermal stress applied to the reflection electrode 50 becomes larger, and peeling at the interface between the reflection electrode 50 and the p-type GaN layer 7 is likely to occur.

The first barrier metal layer 40a according to the embodiment contains Ni having a linear expansion coefficient ($1.33 \times 10^{-5}/°$ C.) near that of Ag. Therefore, the stress applied to the reflection electrode 50 is reduced, and peeling of the reflection electrode 50 from the p-type GaN layer 7 is suppressed. Thereby, the barrier properties to Sn can be improved.

Table 1 shows relationships between the numbers of Ti layers 43 and Ni layers 41 and the barrier properties to Sn. Even in the first barrier metal layer 40a according to the embodiment, migration of Sn will occur in the case where the number of layers is small. That is, in the case where the numbers of Ti layers 43 and Ni layers 41 are both set to two or less, migration of Sn occurs. On the other hand, in the case where the numbers of stacked Ti layers 43 and Ni layers 41 are both set to three or more, migration of Sn does not occur.

TABLE 1

| Number of Ti/Ni layers | Barrier properties |
| --- | --- |
| 1 | x |
| 2 | x |
| 3 | o |
| 5 | o |
| 7 | o |

That is, the first barrier metal layer 40a preferably includes three or more Ti layers 43 and three or more Ni layers 41 alternately disposed. Furthermore, the numbers are both preferably set to seven or less from the viewpoint of reducing manufacturing costs.

Ni has the property of easily reacting with Au and Sn. Therefore, the Ni layer 41 by itself has a limited capability of retaining the barrier properties to Sn. Hence, a structure in which the Ti layer 43 and the Ni layer 41 are alternately disposed is employed. However, the metal combined with the Ni layer 41 is not limited to Ti, and any metal less likely to react with the first bonding metal layer 30a may be used.

TABLE 2

| Material | Use | Melting point(° C.) | Linear expansion coefficient |
| --- | --- | --- | --- |
| Ti | Barrier metal | 1660 | $8.9 \times 10^{-6}$ |
| Pt | Barrier metal | 1770 | $9.0 \times 10^{-6}$ |
| Ag | p-electrode | 961.9 | $1.91 \times 10^{-5}$ |
| Ni | Barrier metal | 1455 | $1.33 \times 10^{-5}$ |
| Ta | Barrier metal | 2990 | $6.5 \times 10^{-6}$ |
| W | Barrier metal | 3400 | $4.5 \times 10^{-6}$ |

Table 2 illustrates materials that can be used for the electrode of the semiconductor light emitting device. Among the materials shown in the table, Ag has the largest linear expansion coefficient, and Ni has the second largest linear expansion coefficient. Ti and Pt have almost the same linear expansion coefficient. Tantalum (Ta) and tungsten (W) having high melting points have smaller linear expansion coefficients than Ti and Pt.

Ni has an intermediate linear expansion coefficient between Ag and other high melting point metals, and may constitute the first barrier metal layer 40a according to the embodiment by being combined with a high melting point metal shown in the table. That is, the first barrier metal layer 40a may contain at least one metal selected from titanium (Ti), platinum (Pt), tantalum (Ta), and tungsten (W) as the second layer.

Second Embodiment

Figure 6A:
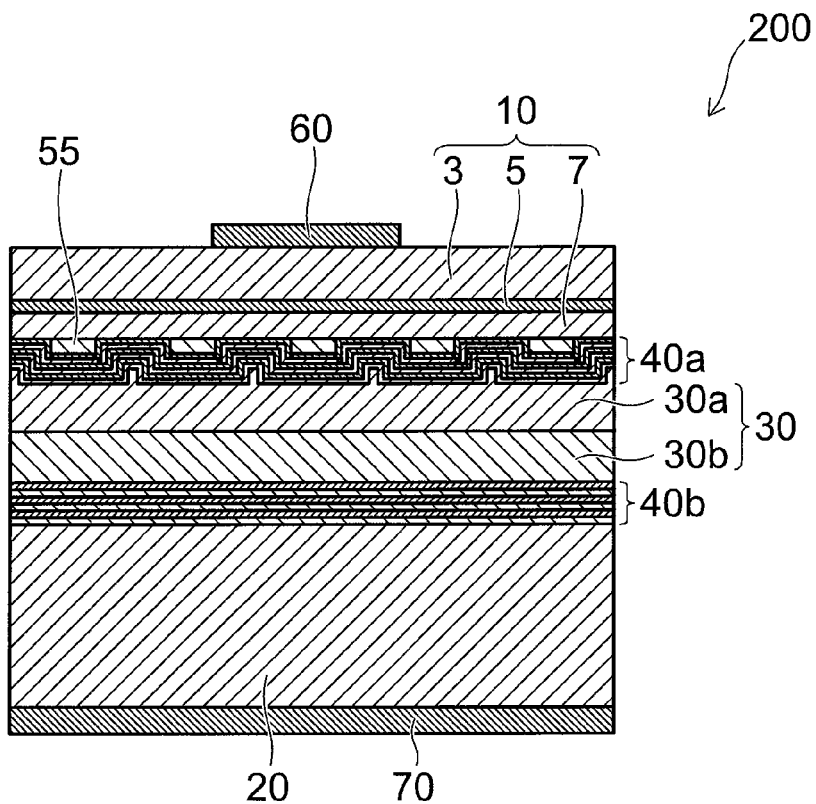
FIGS. 6A and 6B are schematic cross-sectional views illustrating a semiconductor light emitting device according to a second embodiment.
Figure 6B:
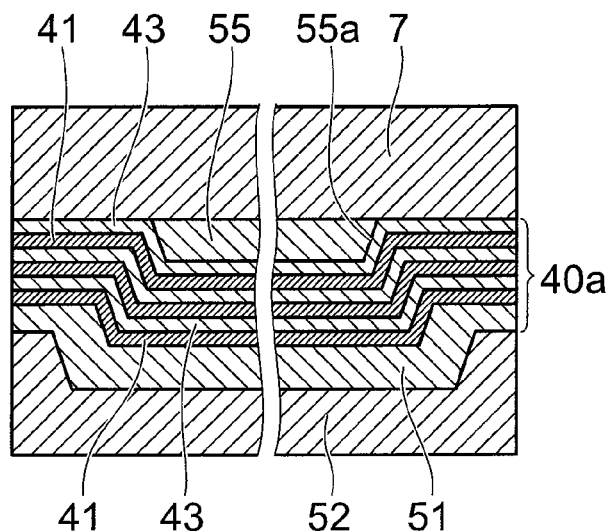

FIG. 6A is a schematic cross-sectional view showing a semiconductor light emitting device 200 according to a second embodiment. FIG. 6B is a partial cross-sectional view showing a reflection electrode 55 and a portion therearound of the semiconductor light emitting device 200.

The semiconductor light emitting device 200 includes the light emitting body 10 and the support substrate 20 supporting the light emitting body. The bonding layer 30 bonding the light emitting body 10 and the support substrate 20 together is provided between the light emitting body 10 and the support substrate 20. Furthermore, the first barrier metal layer 40a is provided between the light emitting body 10 and the bonding layer 30. The first barrier metal layer 40a includes a multiple-layer structure in which the first layer 41 made of nickel (Ni) and the second layer 43 made of a metal having a smaller linear expansion coefficient than nickel are alternately disposed.

The reflection electrode 55 of the embodiment is provided as a plurality of portions being away from one another between the light emitting body 10 and the first barrier metal layer 40a. Such a configuration is advantageous to, for example, the case where the adhesion strength between the reflection electrode 55 and the p-type GaN layer 7 is weak. That is, the p-type GaN layer 7 and the first barrier metal layer 40a are in contact with each other between the adjacent portions of the reflection electrode 55. Therefore, when the adhesion strength between the first barrier metal layer 40a and the p-type GaN layer 7 is higher than that between the reflection electrode 55 and the p-type GaN layer 7, the adhesion between the reflection electrode 55 and the p-type GaN layer 7 is reinforced to improve the barrier properties to Sn. Thereby, degradation can be suppressed in the reflectance and the ohmic contact of the reflection electrode 55.

Furthermore, as shown in FIG. 6B, an end 55a of each portion may be inclined in the reflection electrode 55. Thereby, step cutting of the first barrier metal layer 40a can be suppressed at the end 55a of the portion. That is, migration of Sn via a crack of the first barrier metal layer 40a can be suppressed. Furthermore, by eliminating the step of the end 55a, the stress can be relaxed in the direction of peeling the reflection electrode 55 from the p-type GaN layer 7. Thereby, degradation can be suppressed in light emitting efficiency, improving reliability in the semiconductor light emitting device 200.

The "nitride semiconductor" referred to herein includes group III-V compound semiconductors of $B_x In_y Al_z Ga_{1-x-y-z}N$ ($0 \leq x \leq 1$, $0 \leq y \leq 1$, $0 \leq z \leq 1$, $0 \leq x+y+z \leq 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a light emitting body including a semiconductor light emitting layer;
   a substrate;
   a bonding layer between the light emitting body and the substrate, the bonding layer bonding the light emitting body to the substrate;
   a first barrier metal layer between the light emitting body and the bonding layer, the first barrier metal layer including a first layer made of nickel and a second layer made of a metal having a linear expansion coefficient that is less than nickel, the first layer and the second layer being alternately disposed in a multiple-layer structure; and
   an electrode between the light emitting body and the first barrier metal layer, and being made of a metal having a linear expansion coefficient that is closer to the linear expansion coefficient of nickel than the linear expansion coefficient of the second layer.

2. The device according to claim 1, wherein the electrode contains silver (Ag).

3. The device according to claim 1, further comprising:
   a second barrier metal layer between the bonding layer and the substrate,
   wherein the second barrier metal layer includes a first layer made of nickel and a second layer made of a metal having a linear expansion coefficient that is less than nickel, the first layer and the second layer being alternately disposed in a multiple-layer structure.

4. The device according to claim 3, wherein the second barrier metal layer has the same multiple-layer structure as the first barrier metal layer.

5. The device according to claim 1, wherein the second layer contains at least one metal selected from titanium (Ti), platinum (Pt), tantalum (Ta), and tungsten (W).

6. The device according to claim 1, wherein the multiple-layer structure includes three or more of the first layer and three or more of the second layer.

7. The device according to claim 1, wherein the multiple-layer structure includes between three and not more than seven of the first layer and between three and not more than seven of the second layer.

8. The device according to claim 1, wherein the second layer is provided between the electrode and a first layer adjacent to the electrode.

9. The device according to claim 1, wherein the first layer is provided between the bonding layer and a second layer adjacent to the bonding layer.

10. The device according to claim 1, wherein a thickness of each of the first layer and the second layer is not less than 50 nm and not more than 500 nm.

11. The device according to claim 1, wherein the bonding layer contains gold (Au) and tin (Sn).

12. The device according to claim 1, wherein the bonding layer comprises Au and Sn; and
    a portion nearer to the first barrier metal layer has a smaller proportion of Sn to Au.

13. The device according to claim 1, wherein
    the light emitting body includes a p-type GaN layer and an n-type GaN layer; and
    the semiconductor light emitting layer is provided between the p-type GaN layer and the n-type GaN layer.

14. The device according to claim 1, wherein the electrode is electrically connected to the p-type GaN layer.

15. The device according to claim 1, wherein the electrode includes a plurality of portions between the light emitting body and the first barrier metal layer; and each of the portions is separated from one another.

16. The device according to claim 15, wherein an end of a portion in the plurality of portions is inclined and a width of the portion becomes narrower in a direction from the light emitting body to the first barrier metal layer.

17. A method for manufacturing a semiconductor light emitting device comprising:
    forming an electrode on a light emitting body;
    forming a first barrier metal layer including a first layer made of nickel and a second layer made of a metal having a linear expansion coefficient that is less than nickel, the first layer and the second layer being alternately disposed in a multiple-layer structure on a substrate;
    forming a second barrier metal layer including a third layer made of nickel and a fourth layer made of a metal having a linear expansion coefficient that is less than nickel, the third layer and the fourth layer being alternately stacked in a multiple-layer structure on the electrode formed on the light emitting body, the electrode being made of a metal having a linear expansion coefficient that is closer to the linear expansion coefficient of nickel than that of the fourth layer; and
    bonding the second barrier metal layer on the light emitting body and the first barrier metal layer on the substrate across a bonding layer.

18. The method according to claim 17, wherein the light emitting body is bonded to the substrate by thermocompression via the bonding layer comprising gold (Au) and tin (Sn).

19. The method according to claim 17, wherein
    the bonding layer includes a pair of stacked structures, one of the stacked structures including a Au layer and a AuSn layer provided on the first barrier metal layer and the other of the stacked structure including a Au layer and a AuSn layer provided on the second barrier metal layer;
    each of the Au layers is provided respectively between one of the AuSn layers and the first barrier metal layer or the second barrier metal layer; and
    the AuSn layer provided on the first barrier metal layer and the AuSn layer provided on the second barrier metal layer are brought into contact with each other.

20. The method according to claim 17, wherein
    the bonding layer includes a pair of stacked structures provided on the first barrier metal layer and the second barrier metal layer respectively, one of the stacked structures including a Au layer and a AuSn layer and the other of the stacked structures including a Au layer; and
    the AuSn layer included in the one of the stacked structure is brought into contact with the Au layer included in the other of the stacked structure.

* * * * *